United States Patent
Wang et al.

(10) Patent No.: US 7,550,375 B2
(45) Date of Patent: Jun. 23, 2009

(54) METHOD FOR FORMING METAL BUMPS

(75) Inventors: Sheng-Ming Wang, Taoyuan (TW);
Shuo-Hsun Chang, Zhongli (TW);
Kuo-Hua Chang, Zhongli (TW);
Chi-Chih Huang, Taipei (TW);
Chih-Cheng Chen, Taoyuan County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 382 days.

(21) Appl. No.: 11/635,498

(22) Filed: Dec. 8, 2006

(65) Prior Publication Data
US 2007/0218676 A1 Sep. 20, 2007

(30) Foreign Application Priority Data
Mar. 17, 2006 (TW) .............................. 95109338 A

(51) Int. Cl.
*H01L 21/44* (2006.01)
(52) U.S. Cl. ................. 438/613; 438/614; 257/E21.509
(58) Field of Classification Search ................. 438/613, 438/614
See application file for complete search history.

(56) References Cited

U.S. PATENT DOCUMENTS

| | | | | |
|---|---|---|---|---|
| 5,393,697 A * | 2/1995 | Chang et al. | ................. | 438/613 |
| 5,707,902 A * | 1/1998 | Chang et al. | ................. | 438/614 |
| 6,024,274 A * | 2/2000 | Chang et al. | ........... | 228/180.22 |
| 6,114,187 A * | 9/2000 | Hayes | ........................ | 438/106 |
| 6,249,051 B1 | 6/2001 | Chang et al. | | |
| 6,660,625 B2 * | 12/2003 | Lee et al. | ..................... | 438/613 |
| 6,713,377 B2 * | 3/2004 | Lee et al. | ..................... | 438/614 |
| 6,743,660 B2 * | 6/2004 | Lee et al. | ..................... | 438/108 |
| 6,759,318 B1 | 7/2004 | Chang | | |
| 6,809,020 B2 * | 10/2004 | Sakurai et al. | .............. | 438/613 |
| 6,828,221 B2 * | 12/2004 | Iijima et al. | ................. | 438/616 |
| 6,929,979 B2 * | 8/2005 | Andoh | ........................ | 438/108 |
| 7,180,184 B2 * | 2/2007 | Shen | ......................... | 257/737 |
| 7,187,078 B2 * | 3/2007 | Lin et al. | ..................... | 257/748 |
| 2005/0142836 A1 * | 6/2005 | Haze | ........................... | 438/613 |

* cited by examiner

*Primary Examiner*—David A Zarneke
(74) *Attorney, Agent, or Firm*—Rabin & Berdo, PC

(57) ABSTRACT

A method for forming metal bumps is disclosed. Steps of the method include supplying a substrate containing a plurality of pads; forming a first photoresist layer on the substrate, herein the first photoresist layer covers the pads; performing a planarization step to remove a portion of the first photoresist layer so as to expose the pads; forming a conductive layer on the first photoresist layer and the pads; electroplating a metal layer on the conductive layer; forming a patterned second photoresist layer on the metal layer; a portion of the metal layer and the conductive layer which are not covered by the patterned second photoresist layer is removed by using the patterned second photoresist layer as a mask; removing the patterned second photoresist layer; and forming a solder mask on the substrate, wherein the solder mask has a plurality of openings to expose the metal layer located on the pads.

25 Claims, 5 Drawing Sheets

METHOD FOR FORMING METAL BUMPS

RELATED APPLICATIONS

The present application is based on, and claims priority from, Taiwan Application Serial Number 95109338, filed Mar. 17, 2006, the disclosure of which is hereby incorporated by reference herein in its entirety.

FIELD OF THE INVENTION

The present invention relates to a fine pitch package process, and more particularly to a method for fabricating metal bumps.

BACKGROUND OF THE INVENTION

FIGS. 1A to 1E illustrate a series of cross views of a conventional process for fabricating metal bumps. First, a substrate 100 with a plurality of pads 102 shown in FIG. 1A is provided. A patterned solder mask 110 is then formed on the substrate 100. The solder mask 110 is first formed to cover the substrate 100, and subsequently a patterning process, such as a photolithography process, is conducted on the solder mask 110 to form a plurality of first openings 112 exposing these pads 102. Next, a conductive layer 120 is formed over the patterned solder mask 110, wherein the side walls of each first opening 112 and these pads 102 are blanketed by the conductive layer 120. Subsequently, a patterned photoresist 130 shown in FIG. 1B is formed on the conductive layer 120, wherein the patterned photoresist 130 has a plurality of second openings 132 used to expose a portion of the conductive layer 120. The formation of the patterned photoresist 130 comprises forming a photoresist layer on the conductive layer 120, and conducting a patterning process, such as photolithography process, to form these second openings 132, wherein each of the second openings 132 communicates with one of the first openings 112 to expose the conductive layer 120. Refer to FIG. 1C. In FIG. 1C a metal layer 140 is formed on the patterned photoresist 130 to fully fill these first openings 112 and to partially fill each of the second openings 132. After the pattern photoresist 130 is removed, the remaining conductive layer 120 and the metal layer 140 are subsequently etched until the portion of the conductive layer 120 that is not covered by the metal layer 140 is removed. Since the conductive layer 120 is much thinner than the metal layer 140, the metal layer 140 and the portion of the conductive layer 120 beneath the metal layer 140 remains (shown in FIG. 1D) when the etching process is completed.

Generally if the metal layer 140 is made of copper, a re-flow process is not necessary, and the remaining metal layer 140 and the portion of the conductive layer 120 beneath thereof can serve as a metal bump. However, if the metal layer 140 is made of tin, a re-flow process may be required to make the remaining metal layer 140 and the portion of the conductive layer 120 beneath thereof to form a pre-solder 150 (Shown in FIG. 1E).

Since the thickness of the metal layer 140 formed via a conventional method is not uniform, the metal bumps or pre-solders each of which is constructed by the combination of the remaining metal layer 140 and the portion of the conductive layer 120 beneath thereof may vary in size. The metal bumps or pre-solders with varying size could reduce the yield, and cannot satisfy the quality requirements of the fine pitch package process, which may increase the manufacturing cost.

SUMMARY OF THE INVENTION

It is desirable, therefore, to provide a developed method of forming the metal bumps with uniform size to increase the processing yield and to reduce the manufacturing cost.

One aspect of the present invention is to provide a method for fabricating metal bumps, wherein a metal layer is panel plated on a plurality of pads; a portion of the metal layer is then removed to make the remained portion of the metal layer located on each of the pads have a uniform thickness, so as to form metal bumps (or pre-solders) with uniform size subsequently. Accordingly the problems of the prior methods due to the formation of metal bumps having various sizes are resolved.

In accordance with a preferred embodiment of the present invention, the method comprises the following steps: First, a substrate is provided, wherein the substrate has a plurality of pads formed thereon. A first photoresist is then formed to cover these pads. A planarization process is conducted to remove a portion of the first photoresist, so as to expose these pads. A conductive layer is formed on these pads and the remaining first photoresist, and a metal layer is subsequently electroplated on the conductive layer. A patterned second photoresist formed on the metal layer is used as a mask for removing the portions of the metal layer and the conductive layer that are not covered by the patterned second photoresist. After removing the patterned second photoresist, a solder mask with a plurality of opening used to expose the metal layer of these pads is formed on the substrate.

In accordance with a preferred embodiment of the present invention, the planarization process is conducted by applying a sand belt grinding machine or a brush wheel-grinding machine.

In accordance with a preferred embodiment of the present invention, the first photoresist could be an organic film or an inorganic film in a liquid phase or in a solid phase.

In accordance with a preferred embodiment of the present invention, the second photoresist could be a dry film or an organic film.

In accordance with the aforementioned embodiments, the features of the present invention is to apply a panel plating process to form a metal layer with a uniform thickness on a plurality of pads; and a portion of the metal layer is then removed to make the metal layer that is located on the pads has a uniform thickness so as to form metal bumps with uniform size subsequently. Thus the problems of prior methods due to the metal bumps having various size are resolved. Therefore, the method provided by the present invention not only can improve the quality of the fine pitch package process but also can reduce the process time and cost more effectively in contrast to the prior.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
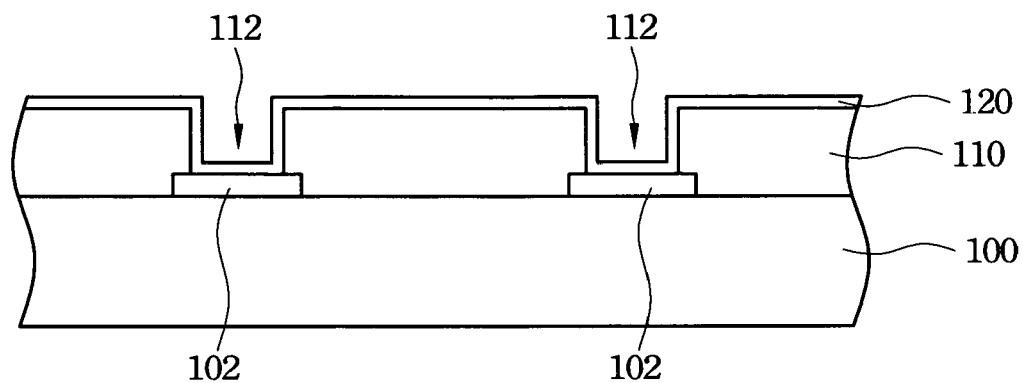
FIGS. 1A to 1E illustrate a series of cross views of a conventional process for fabricating metal bumps.
Figure 1B:
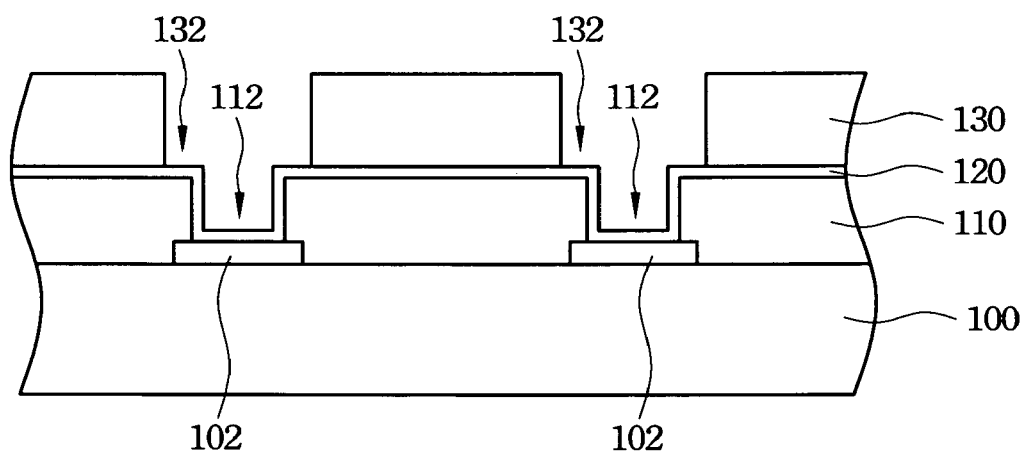
Figure 1C:
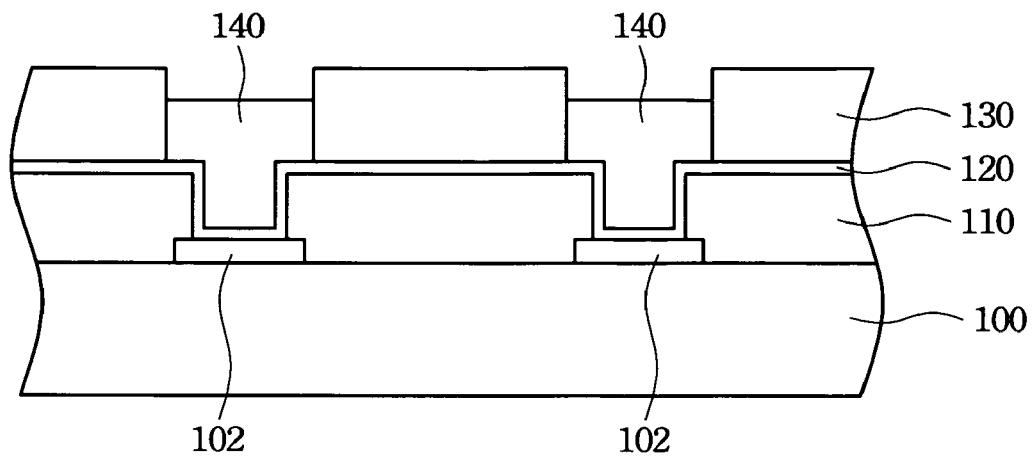
Figure 1D:
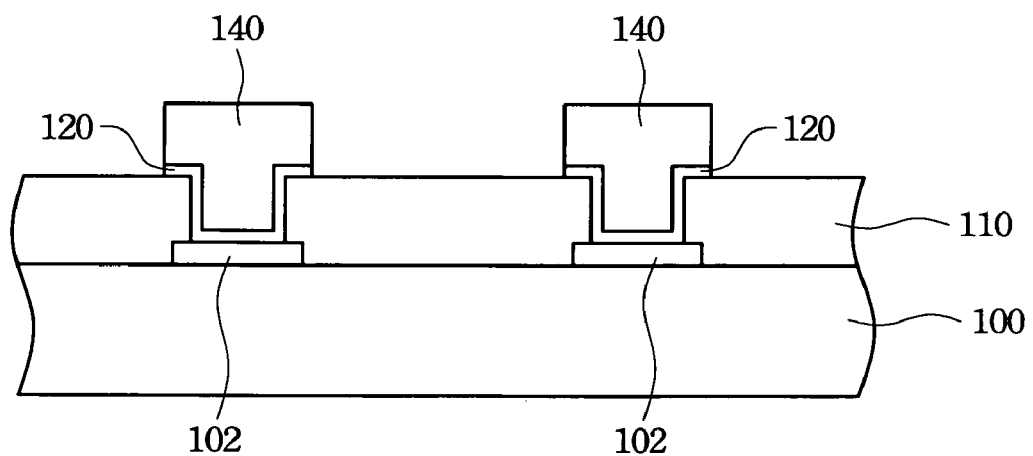
Figure 1E:
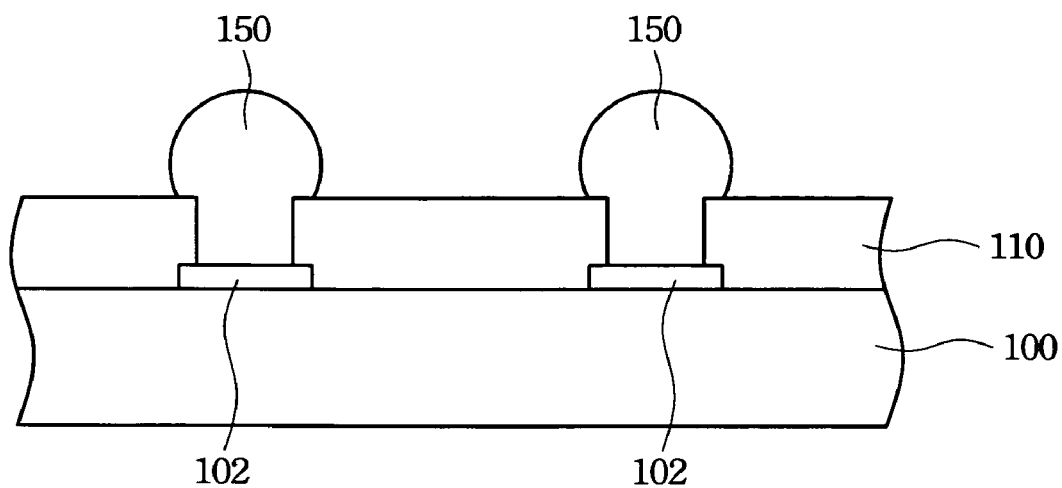
Figure 2A:
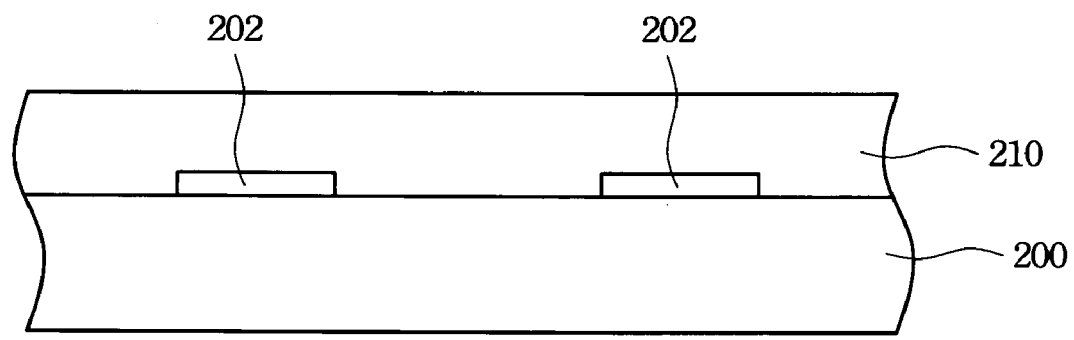
FIGS. 2A to 2F illustrate a series of cross views of a process for fabricating metal bumps in accordance with a preferred embodiment of the present invention.
Figure 2B:
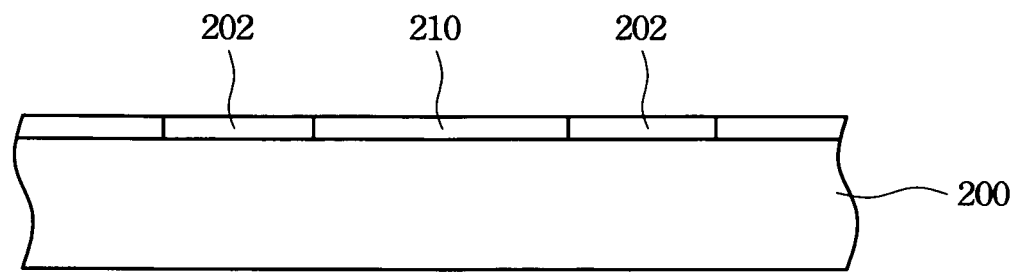
Figure 2C:
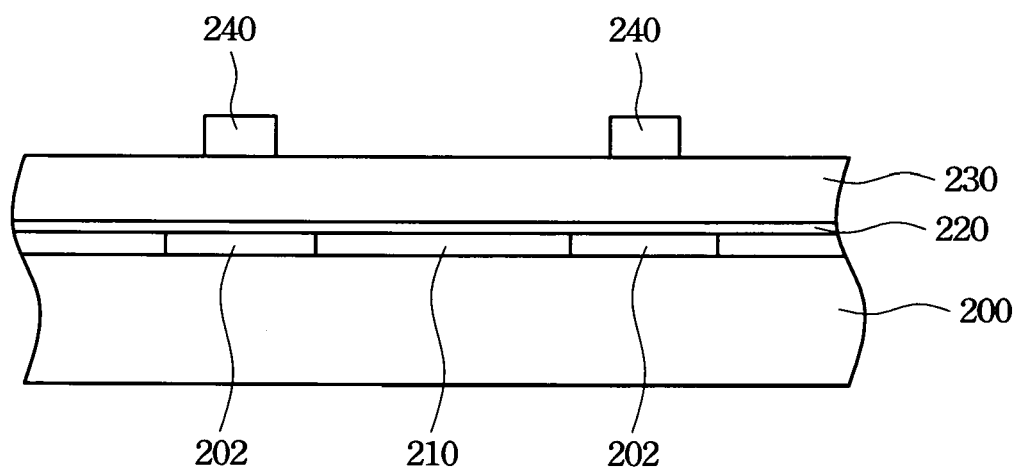
Figure 2D:
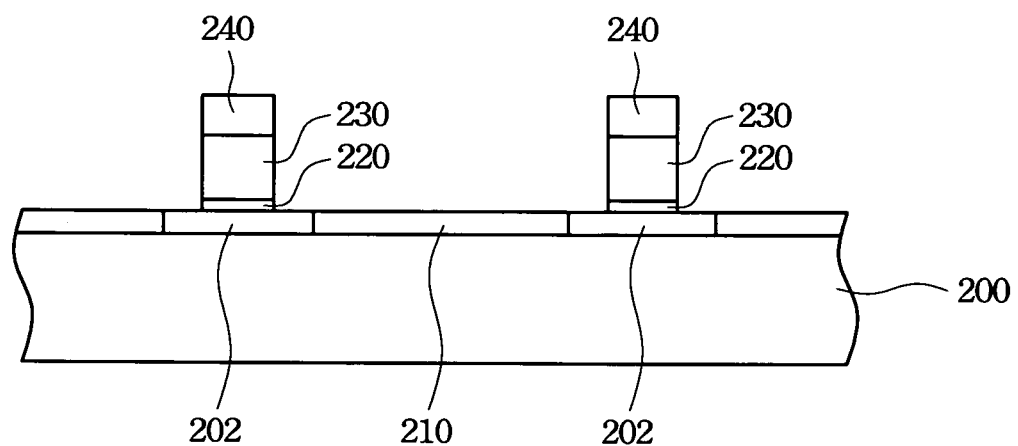
Figure 2E:
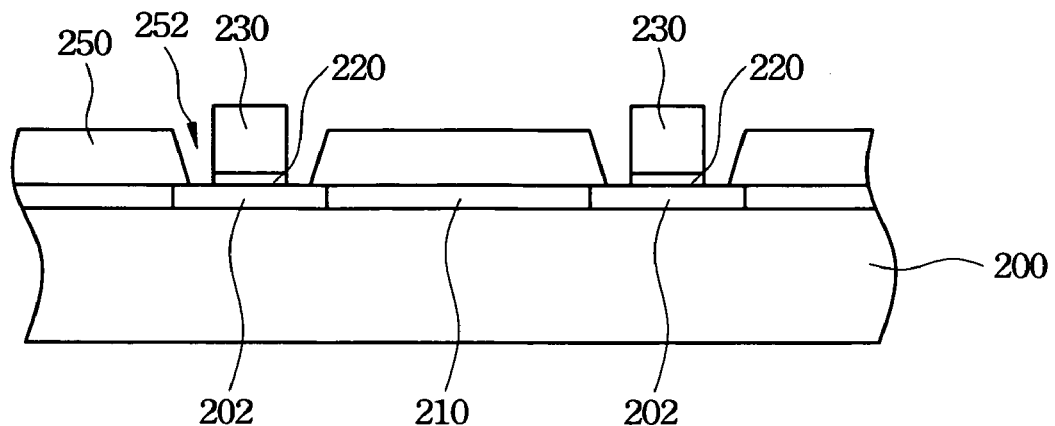
Figure 2F:
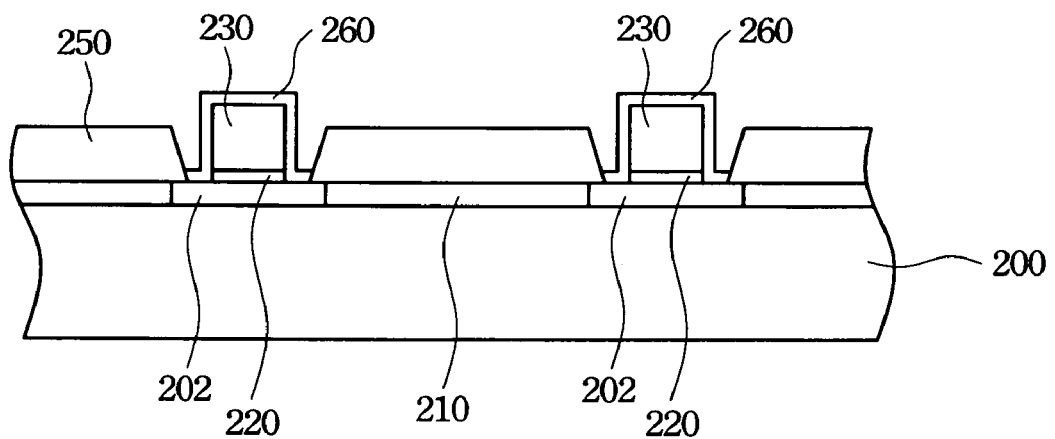

FIGS. 2A to 2F illustrate a series of cross views of a process for fabricating metal bumps in accordance with a preferred embodiment of the present invention. First, a substrate 200 with a plurality of pads 202 is provided (shown in FIG. 2A), wherein the substrate contains no solder mask formed thereon. In the present embodiment, the substrate 200 is but not limited as a printed circuit board (PCB), any substrate that has a circuit set thereon may be available. A first photoresist 210 is then formed on the substrate 200 to cover the pads 202. In the present embodiment, the first photoresist 210 may be an organic film or an inorganic film in a liquid phase that is formed by (but not limited to) a blade coating process, a roller coating process, spray coating process, a curtain coating process or a spin coating process. Otherwise, the first photoresist 210 may be an organic film or an inorganic film in a solid phase that is formed by a hot embossing process or a vacuum embossing process. The formation of the first photoresist 210 further comprises a curing treatment for hardening the first photoresist 210 coated on the substrate 200. Subsequently, a planarization process is conducted on the first photoresist 210 to remove a portion of the first photoresist 210 and to expose the pads 202 (shown in FIG. 2B). In the present embodiment a sand belt grinding machine or a brush wheel-grinding machine is applied to remove the portion of the first photoresist 210 during the planarization process, wherein the brush wheel-grinding machine may apply a non-woven abrasive grinding wheel or a ceramic grinding wheel; the belt-grinding machine may apply an emery belt. However, other abrasive apparatuses or materials may be used for conducting the planarization process. After the planarization process, a conductive layer 220 is formed on the pads 202 and the patterned first photoresist 210, shown in FIG. 2C. In the present embodiment, the material of the conductive layer 220 may be consisted of Au, Ni, Cu, Ag, Sn, Pb, Bi, Pd, Al, Fe, Cd, Zn or an arbitrary combination thereof, and the method for forming the conductive layer 220 may comprise sputtering, electroplating, chemical vapor deposition (CVD) or electroless plating. Then a metal layer 230 is electroplated on the conductive layer 220. In the present embodiment, the material of the metal layer 230 consists of Cu, Ag, Sn, Pb, Bi or the arbitrary combination thereof, and the method for forming the metal layer 230 may comprise vertical electroplating or horizontal electroplating. A patterned second photoresist 240 is then formed over the metal layer 230. In the present embodiment, the second pattern photoresist is a dry film or an organic film. The formation of the patterned photoresist 240 comprises the following steps: First a second photoresist 240 is formed on the metal layer 230, then a portion of the second photoresist 240 is removed by an exposure and development process to form the second patterned photoresist 240 shown in FIG. 2C. Wherein the formation method of the patterned second photoresist 240 may comprise printing, roller coating, spry coating, curtain coating or spin coating, and the light source of the exposure and development process may be an ultraviolet (UV) light source or a laser beam. Then in regard to the FIG. 2D, the patterned second photoresist 240 is used as a mask to remove the portion of the conductive layer 220 and the metal layer 230 that are not covered by the patterned second photoresist 240. The patterned second photoresist 240 is then removed, shown in FIG. 2E. In the present embodiment the process of removing the developed portion of the second photoresist 240 comprises soaking the portion of the second photoresist 240 in an organic solution or an inorganic solution; or even spraying an organic solution or an inorganic solution on the developed portion of the second photoresist 240. Wherein the inorganic solution consists of NaOH or KOH; the organic solution consists of acetone, N-Methyl-2-Pyrrolidone (NMP), aminoethoxyethanol (AE), Dimethoxyamphetamine (DMA), Dimethylformamide (DMF) or Tetrahydrofuran (THF). Subsequently, a solder mask 250 is formed on the substrate 200, wherein the solder mask 250 has a plurality of openings to expose the remaining portions of the conductive layer 220 and the metal layer 230 that are located on the pads 202. In the present embodiment, the material of the solder mask 250 consists of (but not limited to) green paint. The solder mask 250 may comprise an organic film or an inorganic film in liquid phase formed by blade coating, roller coating, spray coating, curtain coating or spin. Otherwise the solder mask 250 may comprise an organic film or an inorganic film in solid phase formed by a hot embossing process or a vacuum embossing process. Finally, a protective layer 260 is formed on the metal layer 230 exposed from the solder mask 250 to enhance the oxidation resistance of the metal layer 230. Wherein the material of the protective layer 260 may consist of Au, Ni, Cu, Ag, Sn, Pb, Bi, Pd, Al, Fe, Cd, Zn or the arbitrary combination thereof. In some preferred embodiment organic solderability preservatives (OSP) may be available to form the protective layer 260.

In short, the features of the present invention is to apply a panel plating process to precisely control the thickness of a metal layer formed on a plurality of pads, thus the metal bumps that are formed by removing a portion of the metal layer can have a uniform size so as to increase the efficiency of the subsequent fine pitch package process, by which the prior problems due to the metal bumps having various sizes can be resolved. Accordingly, applying the method provided by the present invention not only can obtain products with high quality but also can reduce the process time and cost more effectively.

In accordance with the aforementioned embodiments of present invention, the advantages of the present invention is to apply a panel plating process to prevent a metal layer electroplated on a plurality of pads unevenly. Thus the metal bumps that are formed by removing a portion of the metal layer may have a uniform size. Accordingly, the method provided by the present invention can resolve the prior problems existing in the conventional fine pitch package process. In contrast to the prior, the features of the present invention can overcome the drawbacks of the conventional method due to the size variety of the metal bumps. Therefore, the method provided by the present invention not only can improve the process quality in a fine pitch package process but also can reduce the process time and cost more effectively.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming metal bumps, comprising:
providing a substrate with a plurality of pads formed thereon;
forming a first photoresist on the substrate to cover the plurality of pads;
conducting a planarization process to remove a portion of the first photoresist to expose the plurality of pads;
forming a conductive layer on the first photoresist and the plurality of pads;

electroplating a metal layer on the conductive layer;

forming a patterned second photoresist on the metal layer;

removing the portions of the metal layer and the conductive layer that are not covered by the patterned second photoresist by using the patterned second photoresist as a mask;

removing the patterned second photoresist; and forming a solder mask on the substrate, wherein the solder mask has a plurality of openings to expose the metal layer located on the plurality of pads.

2. The method according to claim 1, further comprising forming a protective layer on the portion of the metal layer exposed from the solder mask.

3. The method according to claim 2, wherein the material of the protective layer is selected from a group consisting of Au, Ni, Cu, Ag, Sn, Pb, Bi, Pd, Al, Fe, Cd, Zn, and the combination thereof.

4. The method according to claim 2, wherein the material of the protective layer comprises organic solderability preservatives (OSP).

5. The method according to claim 1, wherein the substrate is a printed circuit board (PCB).

6. The method according to claim 1, wherein the method for forming the first photoresist is selected from a group consisting of a blade coating process, a roller coating process, a spry coating process, a curtain coating process, and a spin coating process.

7. The method according to claim 6, wherein the first photoresist comprises an organic film or an inorganic film in a liquid phase.

8. The method according to claim 1, wherein the method for forming the first photoresist comprises a hot embossing process or a vacuum embossing process.

9. The method according to claim 8, wherein the first photoresist comprises an organic film or an inorganic film in a solid phase.

10. The method according to claim 1, wherein the formation of the first photoresist further comprises a curing treatment for hardening the first photoresist.

11. The method according to claim 1, wherein the planarization process is conducted by applying a sand belt-grinding process.

12. The method according to claim 1, wherein the planarization process is conducted by applying a brush wheel-grinding process.

13. The method according to claim 1, wherein the method for forming the conductive layer is selected from a group consisting of a sputtering process, an electroplating process, a chemical vapor deposition (CVD) process, and an electroless plating process.

14. The method according to claim 1, wherein the material of the conductive layer is selected from a group consisting of Au, Ni, Cu, Ag, Sn, Pb, Bi, Pd, Al, Fe, Cd, Zn, and the combination thereof.

15. The method according to claim 1, wherein the electroplating of the metal layer comprises vertical electroplating or horizontal electroplating.

16. The method according to claim 1, wherein the material of the metal layer is selected from a group consisting of Cu, Ag, Sn, Pb, Bi, and the combination thereof.

17. The method according to claim 1, wherein the patterned second photoresist is a dry film or an organic film.

18. The method according to claim 1, wherein the formation of the patterned second photoresist comprises:

forming a second photoresist on the metal layer;

conducting an exposure and development process on the second photoresist; and removing the developed portion of the second photoresist.

19. The method according to claim 18, wherein the method for forming the second photoresist is selected from a group consisting of a blade coating process, a roller coating process, a spry coating process, a curtain coating process, and a spin coating process.

20. The method according to claim 18, wherein the method of removing the developed portion of the second photoresist comprises applying an inorganic solution selected from a group consisting of NaOH, KOH, and the combination thereof.

21. The method according to claim 18, wherein the method of removing the developed portion of the second photoresist comprises applying an organic solution selected from a group consisting of acetone, N-Methyl-2-Pyrrolidone (NMP), aminoethoxyethanol_(AE), Dimethoxyamphetamine (DMA), Dimethylformamide (DMF), Tetrahydrofuran (THF), and the combination thereof.

22. The method according to claim 1, wherein the method for forming the solder mask is selected from a group consisting of a blade coating process, a roller coating process, a spry coating process, a curtain coating process, and a spin coating process.

23. The method according to claim 22, wherein the solder mask comprises an organic film or an inorganic film in a liquid phase.

24. The method according to claim 1, wherein the method for forming the solder mask comprises a hot embossing process or a vacuum embossing process.

25. The method according to claim 24, wherein the solder mask comprises an organic film or an inorganic film in a solid phase.

* * * * *